United States Patent
Laquer et al.

(10) Patent No.: US 8,937,383 B2
(45) Date of Patent: Jan. 20, 2015

(54) DIRECT SEMICONDUCTOR CONTACT EBULLIENT COOLING PACKAGE

(71) Applicant: The Boeing Company, Chicago, IL (US)

(72) Inventors: Andrew G. Laquer, Tustin, CA (US); Ernest E. Bunch, Huntington Beach, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/061,534

(22) Filed: Oct. 23, 2013

(65) Prior Publication Data

US 2014/0048236 A1 Feb. 20, 2014

Related U.S. Application Data

(62) Division of application No. 12/638,776, filed on Dec. 15, 2009, now Pat. No. 8,592,971, which is a division of application No. 11/602,605, filed on Nov. 21, 2006, now Pat. No. 7,656,025.

(51) Int. Cl.
*H01L 23/34* (2006.01)
*H01L 23/473* (2006.01)
*H01L 23/44* (2006.01)

(52) U.S. Cl.
CPC .............. *H01L 23/473* (2013.01); *H01L 23/44* (2013.01)
USPC ........... 257/712; 257/713; 257/714; 257/715; 257/E23.08; 257/E23.09; 257/E23.087; 257/E23.091; 257/E23.095; 438/121; 438/122

(58) Field of Classification Search
CPC ... H01L 23/427; H01L 23/4332; H01L 23/44; H01L 23/46; H01L 23/473
USPC ........ 257/678–693, 276, 625, 675, 706, 707, 257/712–722, 796, E33.056, E33.057, 257/E33.058, E33.075, E33.131, 257/E23.08–E23.113; 438/122–127
See application file for complete search history.

(56) References Cited

U.S. PATENT DOCUMENTS

| | | | |
|---|---|---|---|
| 4,694,378 A | | 9/1987 | Nakayama et al. |
| 4,740,866 A | * | 4/1988 | Kajiwara et al. ............... 361/702 |

(Continued)

FOREIGN PATENT DOCUMENTS

| | | |
|---|---|---|
| JP | 57183059 | 11/1982 |
| JP | 57183059 A | * 11/1982 |

(Continued)

OTHER PUBLICATIONS

Bar-Cohen, A., "Thermal packaging for the 21st century: challenges and options," Laboratory for Thermal Management Electronics Department of Mechanical Engineering, Oct. 3-6, 1999.

(Continued)

*Primary Examiner* — Ermias Woldegeorgis
(74) *Attorney, Agent, or Firm* — Gates & Cooper LLP

(57) ABSTRACT

The semiconductor package as well as a method for making it and using it is disclosed. The semiconductor package comprises a semiconductor chip having at least one heat-generating semiconductor device and a volumetrically expandable chamber disposed to sealingly surround the semiconductor chip, the volumetrically expandable chamber filled entirely with a non-electrically conductive liquid in contact with the semiconductor device and circulated within the volumetrically expandable chamber at least in part by the generated heat of the at least one semiconductor device to cool the at least one semiconductor device.

20 Claims, 10 Drawing Sheets

(56) References Cited

U.S. PATENT DOCUMENTS

| | | | |
|---|---|---|---|
| 4,949,164 A | | 8/1990 | Ohashi et al. |
| 5,305,184 A | * | 4/1994 | Andresen et al. ............. 361/699 |
| 5,373,417 A | * | 12/1994 | Barrett ......................... 361/699 |
| 6,317,326 B1 | * | 11/2001 | Vogel et al. ................... 361/704 |
| 6,413,800 B1 | * | 7/2002 | Kyle ............................ 438/115 |
| 7,289,326 B2 | * | 10/2007 | Heydari et al. ............... 361/699 |

FOREIGN PATENT DOCUMENTS

| | | |
|---|---|---|
| JP | 03138966 | 6/1991 |
| JP | 03138966 A * | 6/1991 |

OTHER PUBLICATIONS

Ciccio, J. et al., "Ultra-high density VLSI modules," IEEE Transactions on Components, Hybrids and Manufacturing Technology, vol. CHMT-1, Sep. 3, 1978.

Dan's Data, The Art of SENFU, Oct. 18, 2006, www.dansdata.com/senfu.htm.

\* cited by examiner

DIRECT SEMICONDUCTOR CONTACT EBULLIENT COOLING PACKAGE

CROSS-REFERENCE TO RELATED APPLICATIONS

This application is a divisional of U.S. patent application Ser. No. 12/638,776, entitled "DIRECT SEMICONDUCTOR CONTACT EBULLIENT COOLING PACKAGE," by Andrew G. Laquer et al., filed Dec. 15, 2009, which is a divisional of U.S. patent application Ser. No. 11/602,605, entitled "DIRECT SEMICONDUCTOR CONTACT EBULLIENT COOLING PACKAGE," by Andrew G. Laquer et al., filed Nov. 21, 2006, now issued as U.S. Pat. No. 7,656,025, both of which applications are hereby incorporated by reference herein.

BACKGROUND OF THE INVENTION

1. Field of the Invention

The present invention relates to systems and methods for packaging and cooling semiconductors, and in particular to a system and method for cooling semiconductors using direct contact semiconductor ebullient cooling.

2. Description of the Related Art

Processor speeds have increased dramatically over the past several decades. To achieve such speeds, processors are clocked at increasingly higher clock speed and are designed with greater and greater numbers and densities of semiconductor devices. One difficulty with the higher clock rates and higher densities is that the semiconductor chips that make up such processors can generate heat in amounts sufficient to damage the chip itself unless passive or active cooling techniques are employed. Indeed, the rate at which heat can be removed from such semiconductors is a major factor limiting the maximum processing speed of such devices. This problem is exacerbated by the fact that the chips are also rather small, and the heat is concentrated in very small areas and can include very high temperatures.

High power amplifier semiconductor chips face similar heat dissipation challenges that limit their power output. The heat must be rapidly transferred from the semiconductor crystal to the semiconductor package and safely away from the semiconductor package via a heatsink or some other heat dissipating device.

Most current semiconductor packages utilize only conduction cooling paths to transfer heat away from the semiconductor device to the package and then to a heat sink or other heat dissipating device. Such cooling techniques do not create the thermal paths with sufficient heat flux to permit the higher clock speeds and higher power demanded of current and projected processor and high power amplifier packages.

What is needed is a cooling apparatus and technique that inexpensively provide very high heat flux thermal paths to dissipate heat from semiconductor environments. The present invention satisfies this need.

SUMMARY OF THE INVENTION

To address the requirements described above, a semiconductor package is disclosed herein. The semiconductor package comprises a semiconductor chip having at least one heat-generating semiconductor device and a volumetrically expandable chamber disposed to sealingly surround the semiconductor chip, the volumetrically expandable chamber filled with a non-electrically conductive liquid in contact with the semiconductor device and circulated within the volumetrically expandable chamber at least in part by the generated heat of the at least one semiconductor device to cool the at least one semiconductor device. In another embodiment, a method of cooling a semiconductor device is disclosed. The method comprises the steps of absorbing heat from a semiconductor device via a non-electrically conductive inert liquid in contact with the semiconductor device, sealingly enclosing the semiconductor device and the non-electrically conductive inert liquid in a volumetrically expandable chamber, and passively circulating the non-electrically conductive inert liquid within the volumetrically expandable chamber at least in part by the heat drawn from the semiconductor device. In yet another embodiment, the method comprises the steps of sealingly surrounding the semiconductor device in a volumetrically expandable chamber, filling the volumetrically expandable chamber with a non-electrically conductive liquid that contacts the semiconductor device, and passively circulating the non conductive liquid within the volumetrically expandable chamber by the generated heat of the semiconductor device to cool the semiconductor device.

The foregoing provides a low cost, heat transfer solution that is amenable to high volume production and can be used to improve the performance of virtually any integrated circuit, micro miniature integrated circuits, or other device who's performance is limited by heat flux. This includes currently available commercial integrated circuits that can be repackaged and operated for higher performance. For example, using the heat transfer techniques described below, a repackaged PENTIUM processor may be clocked at double or triple it's current clock rate, or amplifiers can be operated to provide greater power output. Further, future amplifier/processors can be designed from the ground up to take greater advantage of the greater heat transfer offered using these techniques.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Figure 1A:
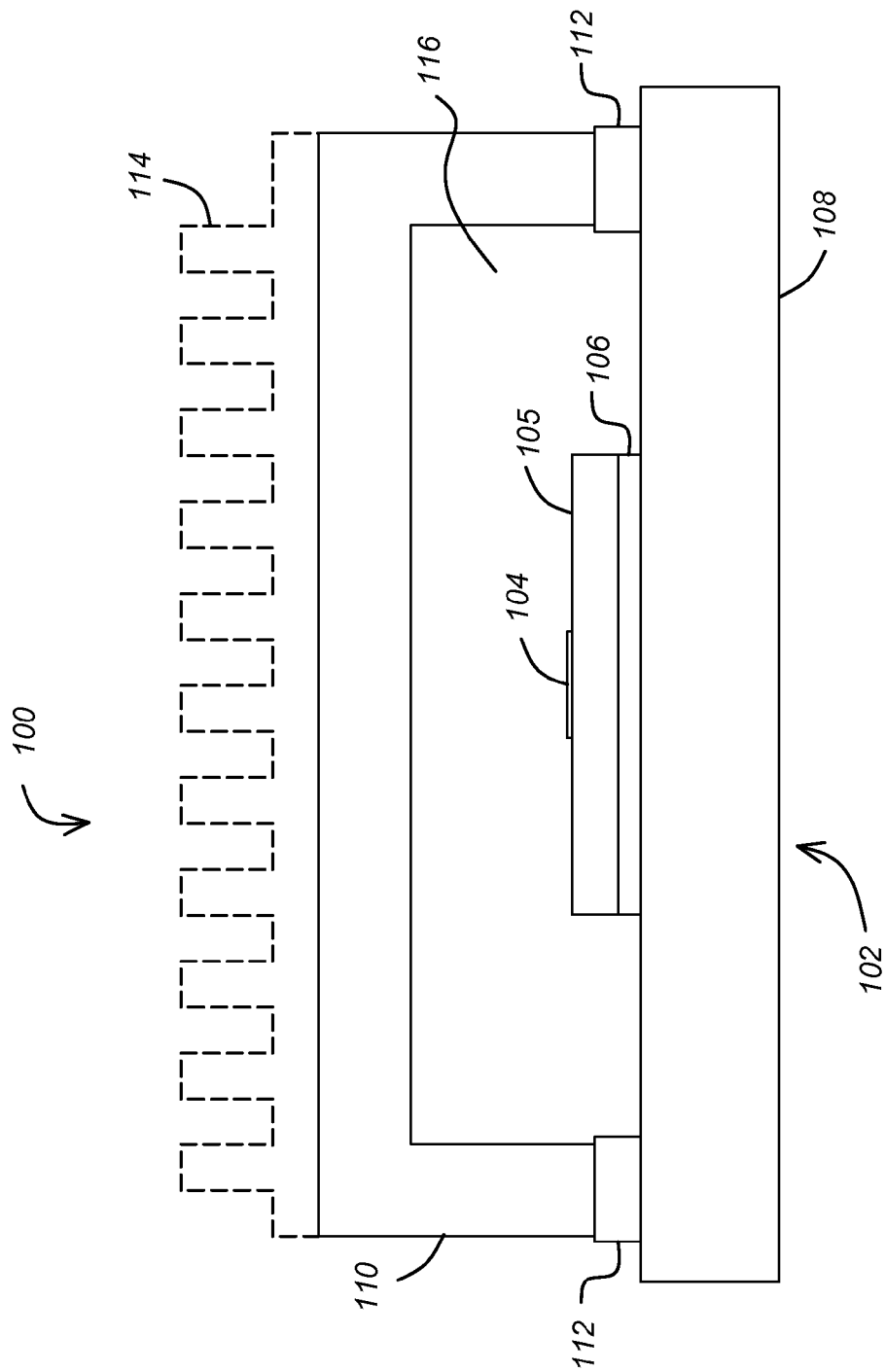
FIG. 1A is a diagram of a classical semiconductor package.

FIG. 1A is a diagram of a classical semiconductor package 100. The semiconductor package 100 is produced by bonding a semiconductor chip 105 having a semiconductor device 104 (such as a transistor) on a substrate/heatsink, or packaging surface 108 with an epoxy or eutectic (solder) bond 106 to form a semiconductor assembly 102. The substrate 108 is then covered by bonding a portion of it to a lid or cover 110 via an epoxy, Eutectic (solder) or hermetic weldment 112. In doing so, the chip 105 is hermetically sealed in a small chamber 116 that is filled with a gas (typically nitrogen). In operation, the heat generated in the semiconductor device 104 flows from its surface, through the semiconductor chip 105, through the epoxy or solder bond 106 and into the substrate 108 or package/heat sink underneath it. Heat transferred to the cover 110 can be drawn away by an optional heat sink 114 which can be on the top or the bottom of the assembly.

What is needed is a design that transfers heat from the semiconductor 104 to the package 100 faster, but maintain the sealed environment, all in a low cost package that does not require active cooling.

Gases conduct heat poorly, but are easy to seal inside a semiconductor package 100 because they are compressible. Liquids can be good heat conductors but most are not compatible with semiconductor operations, (especially in radio, microwave and other high frequency applications) and liquids are difficult to seal inside a small semiconductor package due to their volumetric expansion with temperature and their incompressibility.

At the same time, current techniques for conductive cooling from a semiconductor to the semiconductor package 100 is limited by the thermal resistance of the semiconductor 105 material, the semiconductor bonding materials 106, their thickness the package 100 surface area and other factors.

Prior art heat dissipation systems use diamond, gold or silver embedded epoxies to reduce thermal resistance of the conduction bond joint 106 from the bottom of the semiconductor 105 to the package 100, but this can't improve the heat flow through the semiconductor.

The highest heat fluxes achievable in prior art semiconductor packages 100 are attainable with packages 100 that spray cool the semiconductor package 100 or even directly to the surface of the semiconductor 104, where a liquid is actively sprayed in mostly vapor filled chambers 116, and the heat transfer effected by the resulting liquid to vapor phase change. However, these approaches are "active" and are therefore more complicated, expensive, and prone to failure than passive designs. Such systems also require pressurized systems which use additional energy. Spray-cooling systems also must be designed such that there is not excessive liquid in the semiconductor chamber 116, to avoid the liquid expansion over large temperature ranges from over pressurizing and bursting the chamber 116.

While spray cooling techniques are capable of obtaining a maximum heat flux of a nucleate boiling point, the lack of adequate liquid in the chamber 116 pushes the heat flux from nucleate boiling region to the boiling regimes transition and film regions (towards point "D"), with great loss in available heat flux and higher $\Delta T_e$ ($\Delta T_e$ refers to the temperature difference between solid surface and a liquid adjacent to the surface—for example, in a pot of boiling water, the difference between the temperature of the water adjacent the pot surface and the pot itself).

Figure 1B:
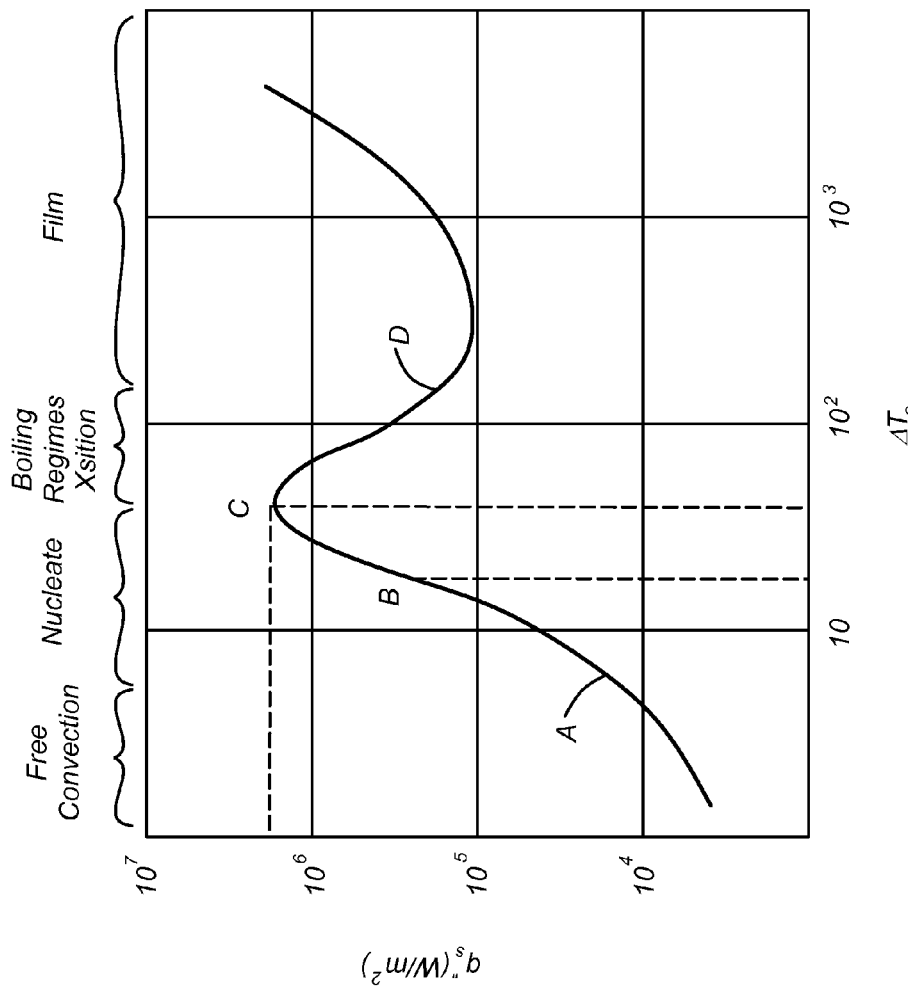
FIG. 1B is a plot of a pool boiling curve.

FIG. 1B is a plot of a pool boiling curve for water, showing the heat flux $q_s''$ (watts/m$^2$) as a function of $\Delta T_e$, the nucleate boiling point (point "C") and boiling regimes transition and film regions (point "D"). FIG. 1B shows that $2 \times 10^6$ watts/m$^2$ (200 watts/cm$^2$) of heat flux is attainable at the maximum pool boiling point (point "C"). Although water is undesirable for some applications that will be in contact with operating semiconductor devices, de-ionized water may be used if antifreeze and dielectric constant requirements are met.

However other fluids that are non-electrically conductive and non-corrosive, and hence more compatible with high frequency electronic semiconductors are available, albeit with ebullient heat transfer coefficients different than water. In one embodiment, the non-electrically conductive fluid has a dielectric constant of approximately 1.85 or less. One such fluid is FLOURINERT or FC-77, which is available from the 3M COMPANY. The heat flux available from use of such a fluid in contact with the top surface of the semiconductor 104 is in addition to the heat flux available through conduction through the chip 105 and out the bottom in standard existing mounting approaches. Importantly, the liquid is in direct contact with the semiconductor's 104 junction and thus it can control the actual junction temperature much better than prior art methods because the density of a liquid in direct contact with the semi-conductor 104 junction is higher than a gas or a gas/liquid spray mixture.

Different non-electrically conductive electronic fluids having a range of boiling temperatures are available from the 3M COMPANY and others, and the designer can select the fluid based on the desired maximum chip junction temperature, actual chip power dissipation and available package size for a fluid reservoir.

The use of the non-electrically conductive liquid tends to clamp the chip's maximum junction temperature at the boiling point of the non-electrically conductive liquid. While F-77 boils at 97 degrees Celsius, other available non-electrically conductive liquids offer other boiling points.

The present invention provides an improved semiconductor package that having a chamber that, when filled, encases the semiconductor in an electronic non-electrically conductive fluid such as 3M's FC72, FC-77 and others. In the preferred embodiment, the non conductive fluid completely fills the cavity with no ullage (i.e. all liquid and no gas). This package has the ability to expand with the fluid volumetric changes over temperature so that the maximum heat flux point on the pool boiling curve (point "C") can be achieved and maintained with the resultant ebullient, convection and conduction heat flow processes all moving heat simultaneously away from the semiconductor 104 to the large package surface 100 area.

Figure 2:
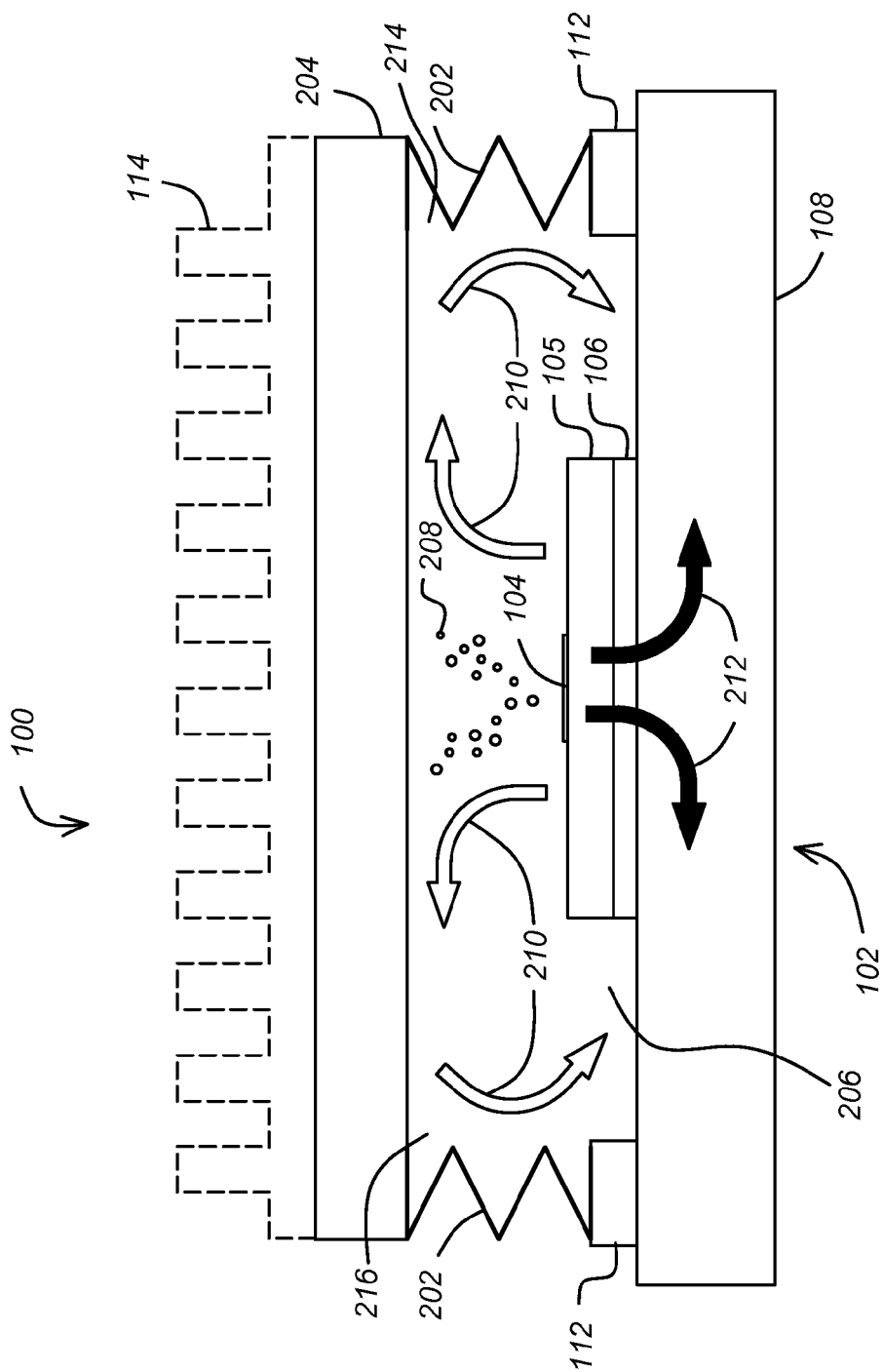
FIG. 2 is a diagram illustrating one embodiment of the present invention.

FIG. 2 is a diagram illustrating one embodiment of the present invention. In this embodiment, the semiconductor package 100 comprises a heat-generating semiconductor device 104 mounted on a semiconductor chip 105. A volumetrically expandable chamber 214 is disposed to sealingly surround the semiconductor chip 105. The volumetrically expandable chamber 105 includes an inert and non-electrically conductive liquid 216 that is circulated within the chamber 105 by the generated heat of the semiconductor device 104, thereby cooling the semiconductor device 104. In one embodiment, the dielectric constant of the non-electrically conductive liquid is 1.85.

In the illustrated embodiment, the volumetrically expandable chamber 214 is formed by a substrate or heat sink 105 coupled to the substrate (e.g. via epoxy or eutectic bond 106), a heat-dissipating cover 204 disposed on a side of the semiconductor chip 105 opposing the substrate 108 and an expandable surround structure 202 sealingly coupled to the cover 216 and the substrate 108. In the illustrated embodiment, the surround structure comprises a bellows 202 expandable in a direction away from the substrate 108. The bellows can be sealingly affixed to the substrate 108 and/or the cover 204 via an epoxy bond, a eutectic bond, or a weld 112. The cover 204 may also optionally comprise a heat sink 114 to draw heat away from the cover 204.

The foregoing configuration provides a conductive heat path 212 away from the semiconductor device 104 through the substrate/heat sink 108, but also provides convection currents 210 and ebullient currents from bubbles 208 that circulate the non-electrically conductive fluid 216 within the chamber 214 and away from the semiconductor device 104, toward the cover 204 and the bellows 202 where the fluid is cooled before returning to the vicinity of the semiconductor device 104. The provision of a convection (passively) circulated non-electrically conductive fluid 216 substantially increases the heat flux over that which is possible via conductive cooling via paths 212 alone.

While the foregoing design provides effective cooling using only passive means (essentially using the heat from the semiconductor device 104 itself as the engine to move non-electrically conductive liquid 216 throughout the chamber 214), improved performance, albeit at higher cost, can be obtained by actively circulating the non-electrically conductive fluid 216 within the chamber 214 or even by pumping the non-electrically conductive fluid to an external heat dissipation device such as a radiator.

To maximize heat transfer, the chamber 214 is preferably filled completely with the non-electrically conductive fluid 216. Although some boiling may occur, any bubbles 208 forming from such boiling quickly move away, create currents, transfer heat away to their surroundings, and disappear, thus creating maximum heat flow as the buoyancy of the hot bubbles 208 moves them away from the heat source.

The foregoing utilizes a "bellows cover" as the top cap of the semiconductor package instead of a conventional ceramic, metal or plastic cover and the package is filled with electronic fluid with a boiling point tailored to the specific chip's needs (FC-72, FC-T7 other inert 3M electronic fluids, and other fluids or mixtures of fluids). A large surface area finned heat sink can subsequently be attached to this cap (or the bottom, or both) to move the heat from the package to the air (or other materials) around it. So configured, the package can passively remove three times as much heat from the semiconductor devices as conventional packaging methods.

The structure produces this functionality by containing an electronic liquid in a hermetically sealed chamber around the semiconductor that can expand with the fluid's volumetric change over large temperature ranges and still maintain hermeticity.

Figure 3:
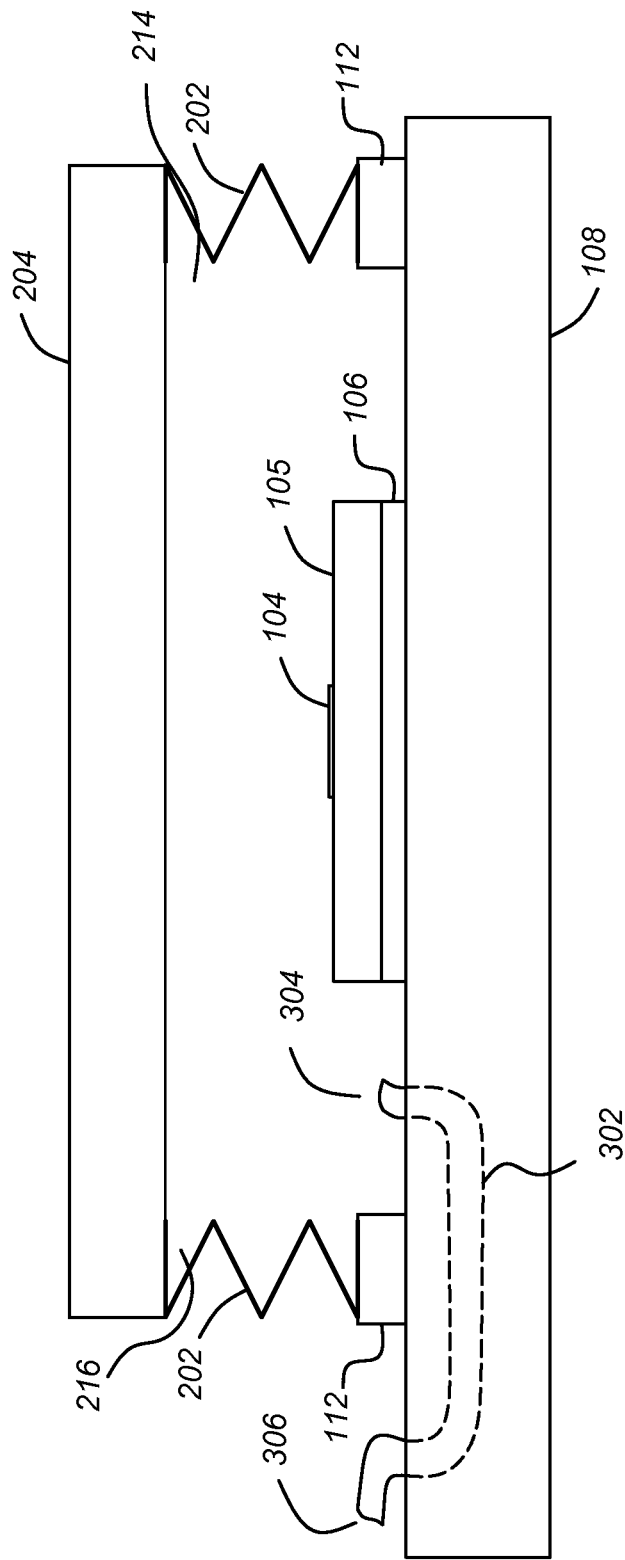
FIG. 3 is a diagram illustrating one embodiment of how the chamber can be filled with the non-electrically conductive liquid.

FIG. 3 is a diagram illustrating one embodiment of how the chamber 214 can be filled with the non-electrically conductive liquid 216. In this embodiment, the substrate/heat sink 108 includes a tube 302 that is used to fill the chamber 214. After the filling is complete, the tube 302 may be pinched off and sealed to effect a hermetic seal at the interior opening 304 or the exterior opening 306. The tube 302 can be fashioned out of copper or any other suitable material that can be cold welded with a simple crimping device. If desired, the tube 302 can be built into the substrate/heat sink 108, whether by drilling or etching appropriate layers. The chamber 214 may also be oriented while being filled so that no air gaps remain when the process is completed. Vacuum filling techniques can also be used in which a vacuum is applied through the tube to evacuate the chamber 214, the valved off, and a second valve opened to a liquid reservoir storing the degassed non-electrically conductive liquid 216. The non-electrically conductive liquid 216 flows into the evacuated chamber 214 with no air pockets or bubbles. The second valve is then closed and the tube crimped to seal the chamber 214. Degassing of the liquid is accomplished by placing the liquid in a vessel and evacuating the vessel to remove any gas.

FIGS. 4-8 are diagrams depicting alternate embodiments of the improved semiconductor package.

Figure 4:
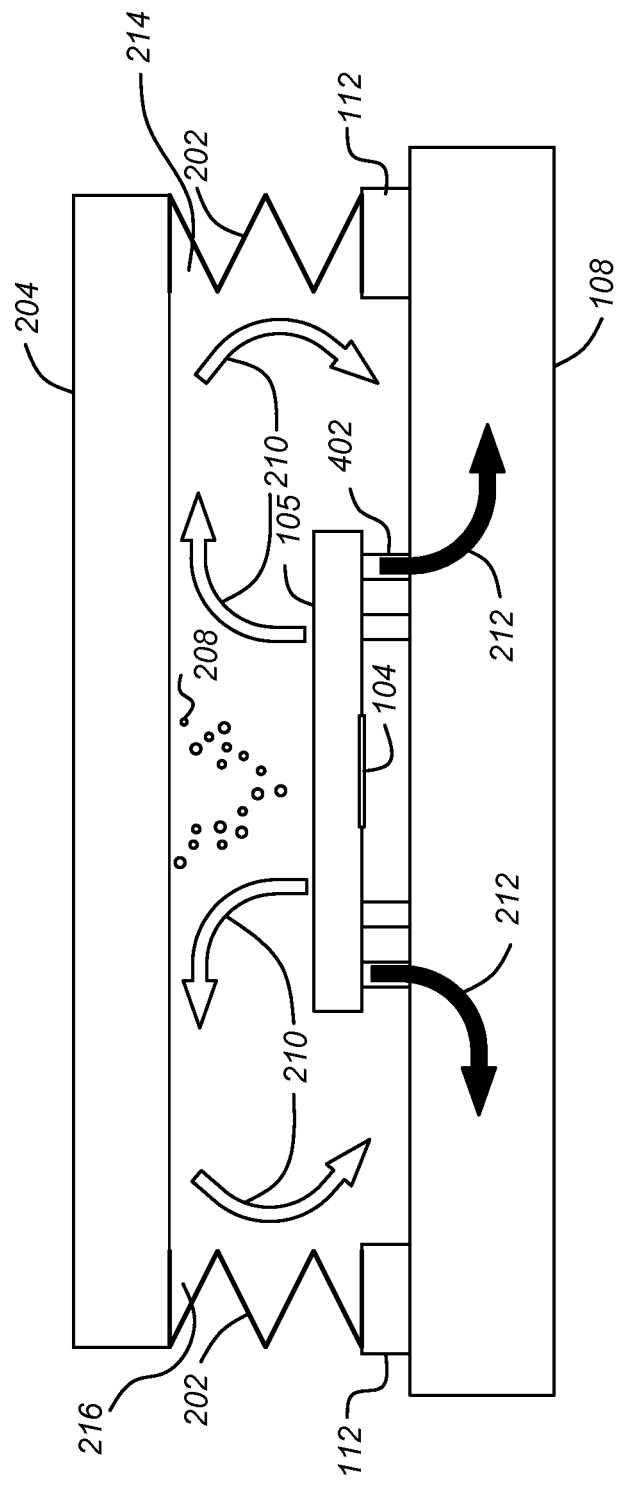
FIG. 4 is a diagram illustrating an embodiment wherein the semiconductor package uses a flip-chip configuration.

FIG. 4 is a diagram illustrating an embodiment wherein the semiconductor package 100 uses a flip-chip configuration. In this configuration, the semi conductor device is disposed on a bottom side of the semiconductor chip 105 (e.g. facing the substrate/heat sink 108), and the semiconductor chip 105 is coupled to the substrate/heat sink 108 via standoffs 402. In this configuration, the conductive heat paths 212 must pass through the standoffs, but the passively circulated convective flow can pass from the semiconductor device 104, around the substrate 105, up to the cover 204, around the bellows 202 and back to the semiconductor chip 104.

Figure 5:
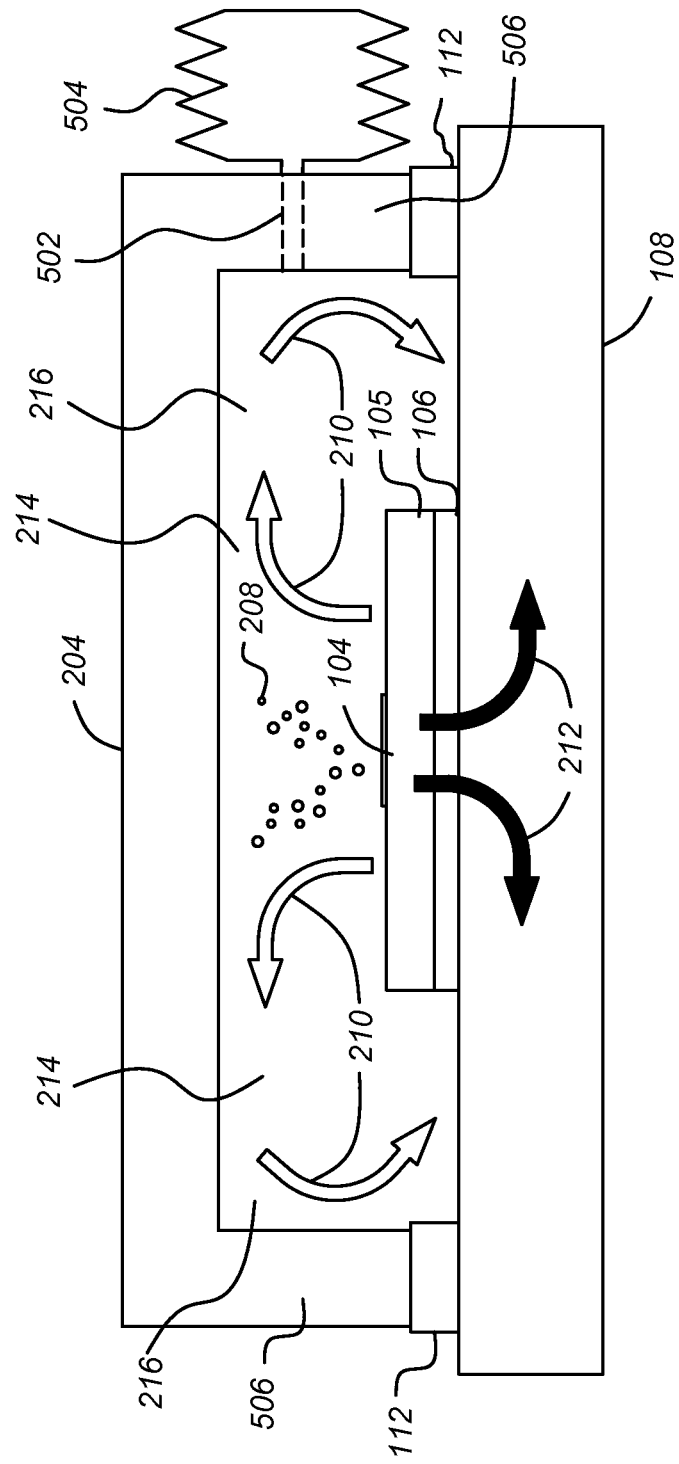
FIG. 5 is a diagram illustrating an embodiment in which the volumetric expansion is provided by an auxiliary chamber.

FIG. 5 is a diagram illustrating an embodiment in which the volumetrically expandable chamber 214 is formed by structures comprising the substrate/heat sink 108, the heat dissipating cover 204, a surround structure 506 sealingly coupled to the cover and the substrate, and a volumetrically expandable auxiliary chamber 504 in fluid communication with the volume enclosed by the cover 204, surround structure 506 and substrate/heatsink 108 via an aperture 502. In the illustrated embodiment, the aperture 502 and auxiliary chamber 504 are disposed on a side of the surround structure 502, however, aperture 502 and auxiliary chamber 504 may instead be disposed through and adjacent the cover 204 or even the substrate/heat sink 108. Also in the illustrated embodiment, the volumetrically expandable auxiliary chamber 504 comprises a expanding bellows, however, any structure that permits volumetric expansion can be used. For example, the auxiliary chamber 504 may comprises a structure fashioned from stretchable material such as rubber.

As was the case in the above illustrated embodiments, the embodiment shown in FIG. 5 uses both conventional conduction cooling paths 212 and convection cooling using the non-electrically conductive liquid 216 in contact with the semiconductor device 104 and completely filling the cavity 214 to cool the semiconductor device 104.

Figure 6:
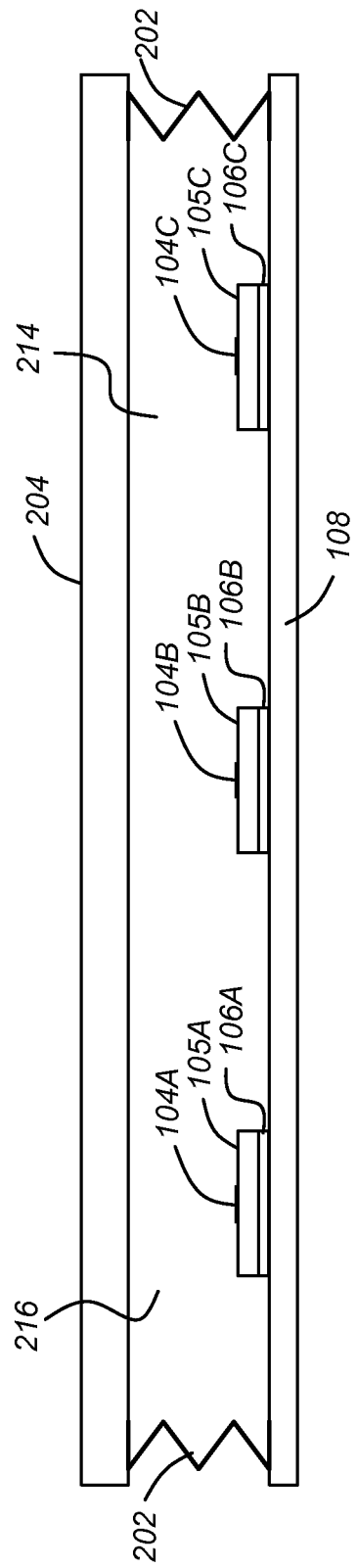
FIG. 6 is a diagram showing an embodiment in which a plurality of semiconductor devices and packages are cooled in a single volumetrically expandable chamber.

FIG. 6 is an illustration of another embodiment of the invention in which a plurality of semiconductor devices 104A-104C (hereinafter collectively referred to as semiconductor devices 104) and chips 105A-105C (hereinafter collectively referred to as chips 105) are bonded to a single substrate/heat sink 108 via multiple bonds 106A-106C ((hereinafter collectively referred to as bonds 106). In this embodiment, the volumetrically expandable chamber 214 encloses the plurality of semiconductor devices 104 and chips 105A, again providing conventional conductive cooling and passive convection cooling using the non conductive liquid 216 in contact with the semiconductor chip.

Figure 7A:
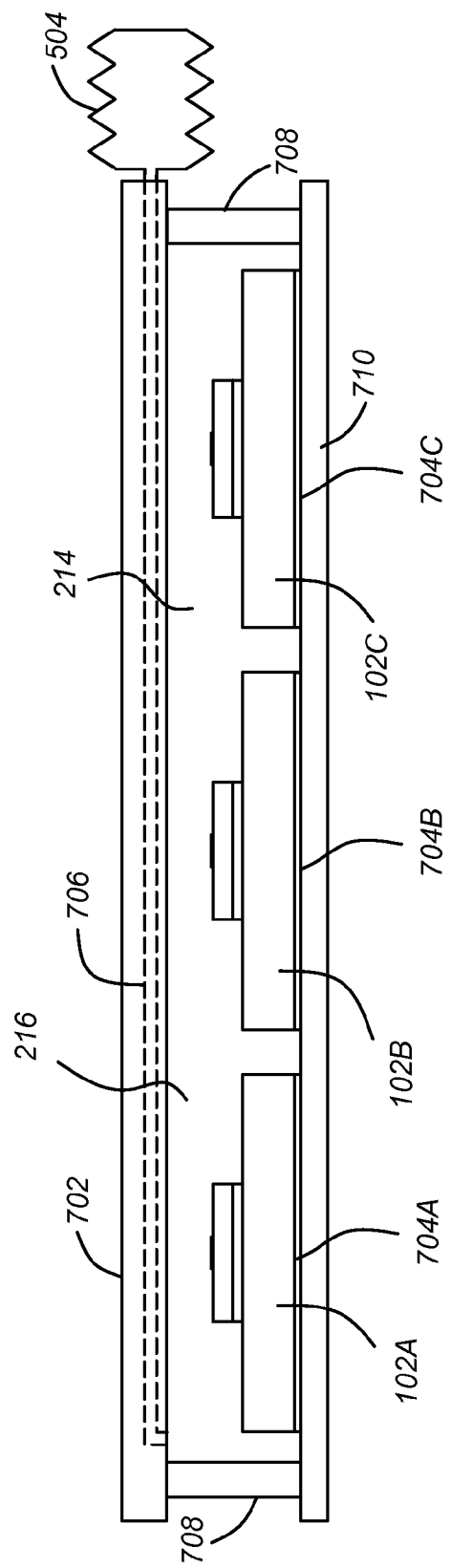
FIG. 7A is an illustration of another alternate embodiment of the invention in which multiple semiconductor assemblies with separate substrates are disposed in the volumetrically expandable chamber.

FIG. 7A is an illustration of another alternate embodiment of the invention in which multiple semiconductor assemblies 102A-102C (hereinafter referred to as semiconductor assemblies 102) with separate substrates are disposed in the volumetrically expandable chamber 214. In this embodiment, the semiconductor assemblies 102 are coupled to a chamber plate/heatsink 710, and the chamber 214 is formed by a rigid surround structure 708 sealingly coupled to the chamber plate/heatsink 710 and a cover 702 sealingly coupled to the surround structure. Volumetric expandability is provided by ducting the non-electrically conductive fluid 216 from the chamber 216 to the auxiliary chamber 504 via duct 706, thereby providing fluid communication between the chamber 214 and the auxiliary chamber. This embodiment may also be practiced by substituting an expandable bellows structure for the rigid surround structure 708. This would obviate the need for the duct 706 and the auxiliary chamber 504.

Figure 7B:
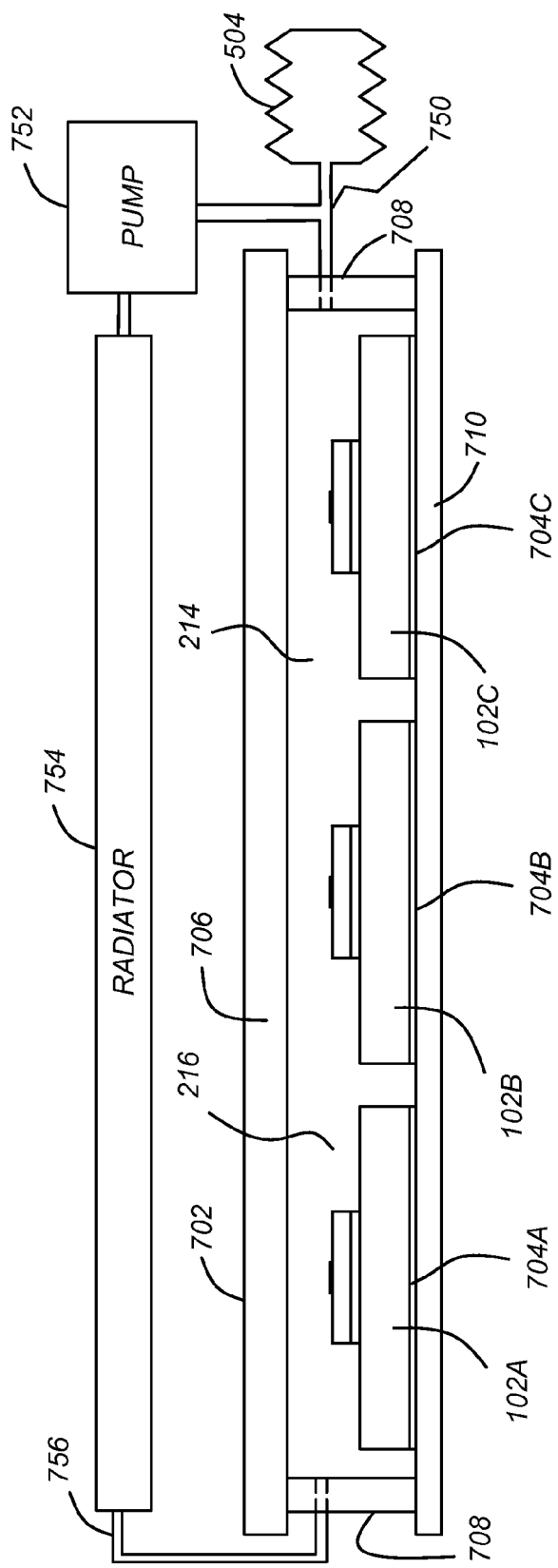
FIG. 7B is an illustration of an embodiment in which the non-electrically conductive liquid is actively circulated within the volumetrically expandable chamber.

FIG. 7B is an illustration of an embodiment in which the non-electrically conductive liquid is actively circulated within the volumetrically expandable chamber 214. In this embodiment, the fluid pump 752 is provided access to the liquid 216 in the chamber 214 via joint 750. The pump 752 cools the liquid 216 by pumping it through a radiator/heat exchanger 754 for cooling purposes. The cooled liquid 216 is then provided to the chamber 214, where it is used to cool the device(s).

Figure 8:
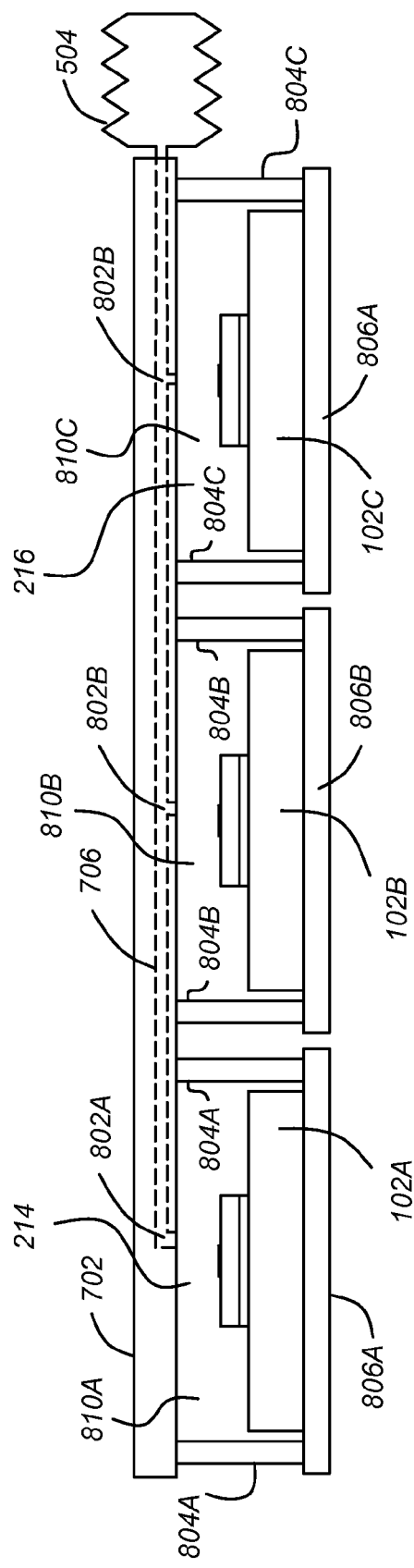
FIG. 8 is a diagram of a further alternate embodiment of the invention

FIG. 8 is a diagram of a further alternate embodiment of the invention. In this embodiment each semiconductor assembly 102 is disposed on an individual chamber plate 806A-806C (hereinafter collectively referred to as chamber plates 806), and the volumetrically expandable chamber 214 comprises a plurality of sub-chambers 810A-810C, each formed by the corresponding individual chamber plate 806, individual surround structure 804, and the community cover 702, hermetically sealed to one another. As was the case in the embodiment illustrated in FIG. 7, the cover 702 includes a duct 706 in fluid communication with a volumetrically expandable auxiliary chamber 504 and the chamber 214. However, in this embodiment, the duct 706 comprises a plurality of openings 802A-802C, each of which providing fluid communication between the sub-chambers 804A-804C and the auxiliary chamber 504 and each other.

Conclusion

This concludes the description of the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching. For example, the cooling capacity of any of the foregoing designs can be increased using secondary cooling techniques to cool the package via thermal exchange with the heat sink, substrate, and/or bellows. Such secondary cooling techniques can include, for example (1) directing a flow of air over the package (e.g. by use of a fan, or by placing the package in a location subject to a flow of air during operation), (2) directing a flow of another fluid over the package (for example, by placing at least part of the package in thermal contact with a fuel line), and/or by (3) placing one or more portions of the package in thermal contact with heat conductive structural members. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method of cooling a heat-generating semiconductor device of a semiconductor chip coupled to a substrate, comprising the steps of:
sealingly surrounding the semiconductor device in a volumetrically expandable chamber, the volumetrically expandable chamber formed by structures comprising a concave structure sealingly coupled directly to the substrate on a substrate surface facing the semiconductor chip, the concave structure comprising a heat-dissipating cover disposed on a side of the semiconductor chip opposing the substrate and not in direct thermal contact with the semiconductor chip;
entirely filling the volumetrically expandable chamber with a non-electrically conductive liquid that contacts the semiconductor device; and
passively circulating the non-conductive liquid within the volumetrically expandable chamber at least in part by the generated heat from the semiconductor device to cool the semiconductor device;
wherein:
the substrate surface continuously faces the semiconductor chip; and
the semiconductor chip comprises a first semiconductor chip surface facing and thermally coupled to the substrate surface.

2. The method of claim 1, wherein the concave structures further comprise:
an expandable surround structure sealingly coupled to the cover and sealingly coupled directly to the substrate on the substrate surface facing the semiconductor chip.

3. The method of claim 2, wherein the surround structure comprises a bellows expandable in a direction away from the substrate.

4. The method of claim 3, wherein the bellows is sealingly affixed to the substrate via an epoxy bond, a eutectic bond, or a weld.

5. The method of claim 1, wherein the non-electrically conductive liquid heated by the at least one semiconductor device remains in a free convection or nucleate boiling regime.

6. The method of claim 5, wherein the concave structure further comprises:
a surround structure sealingly coupled to the heat-dissipating cover and the substrate on a surface facing the semiconductor chip; and
a volumetrically expandable auxiliary chamber in fluid communication with the volume enclosed by the heat-dissipating cover, surround structure and substrate.

7. The method of claim 6, wherein the volumetrically expandable chamber sealingly surrounds a plurality of semiconductor chips.

8. The method of claim 1, wherein the volumetrically expandable chamber sealingly surrounds a plurality of semiconductor chips.

9. The method of claim 1, wherein the semiconductor chip is coupled to the substrate in a flip-chip configuration.

10. The method of claim 9, wherein the semiconductor chip is coupled to the substrate via at least one standoff.

11. A method of cooling a semiconductor device of a semiconductor chip coupled to a substrate, comprising the steps of:
absorbing heat from the semiconductor device via a non-conductive inert liquid in contact with the semiconductor device;
sealingly enclosing the semiconductor device and the non-electrically conductive inert liquid in a volumetrically expandable chamber, the volumetrically expandable chamber formed by structures comprising a concave structure sealingly coupled directly to the substrate on a substrate surface facing the semiconductor chip, the concave structure comprising a heat-dissipating cover disposed on a side of the semiconductor chip opposing the substrate and not in direct thermal contact with the semiconductor chip; and passively circulating the non-electrically conductive inert liquid within the volumetrically expandable chamber at least in part by the heat drawn from the semiconductor device;

wherein:

the substrate surface continuously faces the semiconductor chip; and the semiconductor chip comprises a first semiconductor chip surface facing and thermally coupled to the substrate surface.

12. The method of claim 11, wherein the concave structures further comprise:

an expandable surround structure sealingly coupled to the cover and sealingly coupled directly to the substrate on the substrate surface facing the semiconductor chip.

13. The method of claim 12, wherein the surround structure comprises a bellows expandable in a direction away from the substrate.

14. The method of claim 13, wherein the bellows is sealingly affixed to the substrate via an epoxy bond, a eutectic bond, or a weld.

15. The method of claim 11, wherein the non-electrically conductive liquid heated by the at least one semiconductor device remains in a free convection or nucleate boiling regime.

16. The method of claim 15, wherein the concave structure further comprises:

a surround structure sealingly coupled to the heat-dissipating cover and the substrate on a surface facing the semiconductor chip; and a volumetrically expandable auxiliary chamber in fluid communication with the volume enclosed by the heat-dissipating cover, surround structure and substrate.

17. The method of claim 16, wherein the volumetrically expandable chamber sealingly surrounds a plurality of semiconductor chips.

18. The method of claim 11, wherein the volumetrically expandable chamber sealingly surrounds a plurality of semiconductor chips.

19. The method of claim 11, wherein the semiconductor chip is coupled to the substrate in a flip-chip configuration.

20. The method of claim 19, wherein the semiconductor chip is coupled to the substrate via at least one standoff.

* * * * *